United States Patent
Chan et al.

(10) Patent No.: US 9,654,344 B2
(45) Date of Patent: May 16, 2017

(54) DE-CONGESTING DATA CENTERS WITH WIRELESS POINT-TO-MULTIPOINT FLYWAYS

(71) Applicant: Cisco Technology, Inc., San Jose, CA (US)

(72) Inventors: Douglas Chan, San Jose, CA (US); David R. Oran, Cambridge, MA (US)

(73) Assignee: Cisco Technology, Inc., San Jose, CA (US)

( * ) Notice: Subject to any disclaimer, the term of this patent is extended or adjusted under 35 U.S.C. 154(b) by 111 days.

(21) Appl. No.: 14/801,532

(22) Filed: Jul. 16, 2015

(65) Prior Publication Data

US 2017/0019305 A1    Jan. 19, 2017

(51) Int. Cl.
| | | |
|---|---|---|
| *H04Q 11/00* | (2006.01) | |
| *H04L 12/64* | (2006.01) | |
| *H05K 7/14* | (2006.01) | |
| *H04L 12/24* | (2006.01) | |
| *H04B 7/0452* | (2017.01) | |
| *H04B 7/06* | (2006.01) | |

(52) U.S. Cl.
CPC ....... *H04L 41/0896* (2013.01); *H04B 7/0452* (2013.01); *H04B 7/0626* (2013.01); *H04L 12/6418* (2013.01); *H04Q 11/0005* (2013.01); *H05K 7/1485* (2013.01)

(58) Field of Classification Search
CPC . H04L 41/08; H04L 41/0896; H04L 12/6418; H04B 7/0452; H04B 7/0626; H04Q 11/0005; H04K 7/1485
See application file for complete search history.

(56) References Cited

U.S. PATENT DOCUMENTS

| | | | | |
|---|---|---|---|---|
| 2011/0087799 A1* | 4/2011 | Padhye | ............... | H04L 12/6418 709/235 |
| 2011/0228779 A1* | 9/2011 | Goergen | ................. | H04L 49/40 370/392 |
| 2012/0311127 A1* | 12/2012 | Kandula | ............... | H04W 16/28 709/224 |
| 2013/0107853 A1* | 5/2013 | Pettus | ................... | H04W 84/10 370/330 |
| 2013/0108263 A1* | 5/2013 | Srinivas | ............... | H04Q 3/0083 398/45 |

(Continued)

OTHER PUBLICATIONS

Halperin et al., "Augmenting Data Center Networks with Multi-Gigabit Wireless Links", Aug. 15-19, 2011, SIGCOMM'11, ACM 978-1-4503-0797-0/11/08, pp. 38-49.*

(Continued)

*Primary Examiner* — Paul H Masur
(74) *Attorney, Agent, or Firm* — Polsinelli LLP

(57) ABSTRACT

In one embodiment, a source top-of-rack (ToR) switch may identify multiple destination ToR switches from a group of ToR switches to send data traffic to. The source ToR switch may be connected to the group of ToR switches via a base network. The system may determine whether each destination ToR switch is suitable for receiving data transmission via a point-to-multipoint wireless flyway. The two or more destination ToR switches that are determined to be suitable may be considered flyway candidate ToR switches. The system may establish the point-to-multipoint wireless flyway between the source ToR switch and the flyway candidate ToR switches. The system may then transmit the data traffic from the source ToR switch to each of the flyway candidate ToR switches via the point-to-multipoint wireless flyway.

14 Claims, 8 Drawing Sheets

(56) References Cited

U.S. PATENT DOCUMENTS

| | | | | |
|---|---|---|---|---|
| 2013/0191567 A1* | 7/2013 | Rofougaran | ............. | H04B 7/10 |
| | | | | 710/105 |
| 2014/0233460 A1* | 8/2014 | Pettus | ...................... | H04Q 1/15 |
| | | | | 370/328 |
| 2014/0341568 A1* | 11/2014 | Zhang | ................. | H04J 14/0212 |
| | | | | 398/34 |
| 2015/0223337 A1* | 8/2015 | Steinmacher-Burow | ................... | H05K 1/181 |
| | | | | 361/679.31 |
| 2015/0280827 A1* | 10/2015 | Adiletta | .................... | H01P 3/10 |
| | | | | 398/116 |
| 2015/0288410 A1* | 10/2015 | Adiletta | ................... | H04B 1/40 |
| | | | | 455/73 |
| 2016/0344641 A1* | 11/2016 | Javidi | ................... | H04L 47/283 |

OTHER PUBLICATIONS

Cui, Wenzhi et al., "DiFS: Distributed Flow Scheduling for Data Center Networks," Nanjing University, China, Jul. 28, 2013.

Kandula, Srikanth et al., "Flyways to De-Congest Data Center Networks," Microsoft Research, Oct. 23, 2009.

Ji, Philip N. et al., "Demonstration of High-Speed MIMO OFDM Flexible Bandwidth Data Center Network," Optical Society of America, 2012.

Katayama, Y. et al., "MIMO Link Design Strategy for Wireless Data Center Applications," IEEE Wireless Communications and Networking Conference: Services, Applications, and Business, 2012.

Gesbert, David, "Advances in Multiuser MIMO Systems (Tutorial Part II) Emerging Topics in Multiuser MIMO Networks," IEEE PIMRC Conference, Sep. 2007.

* cited by examiner

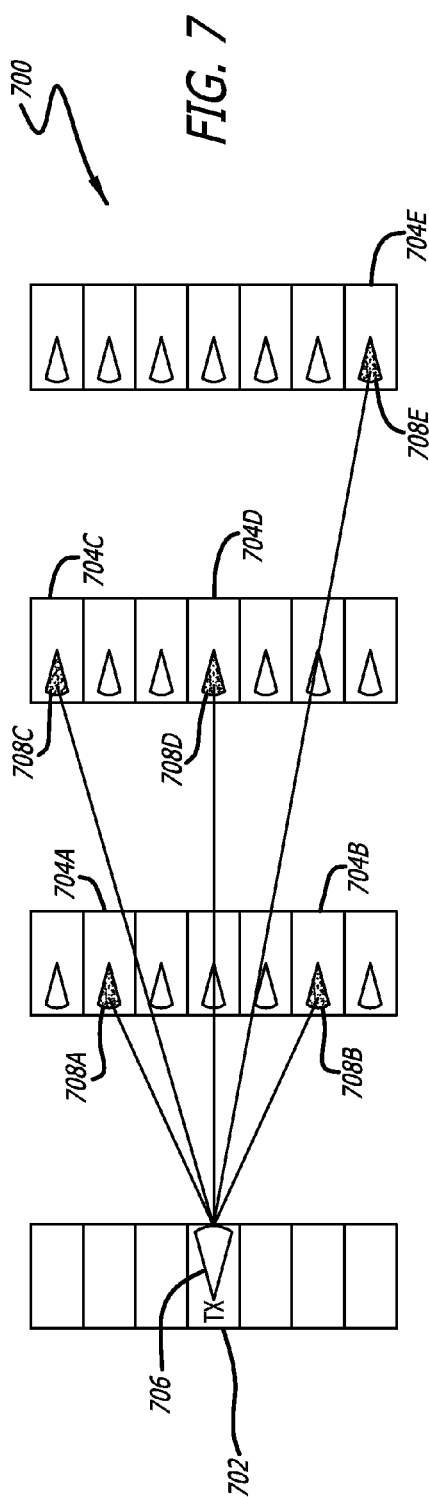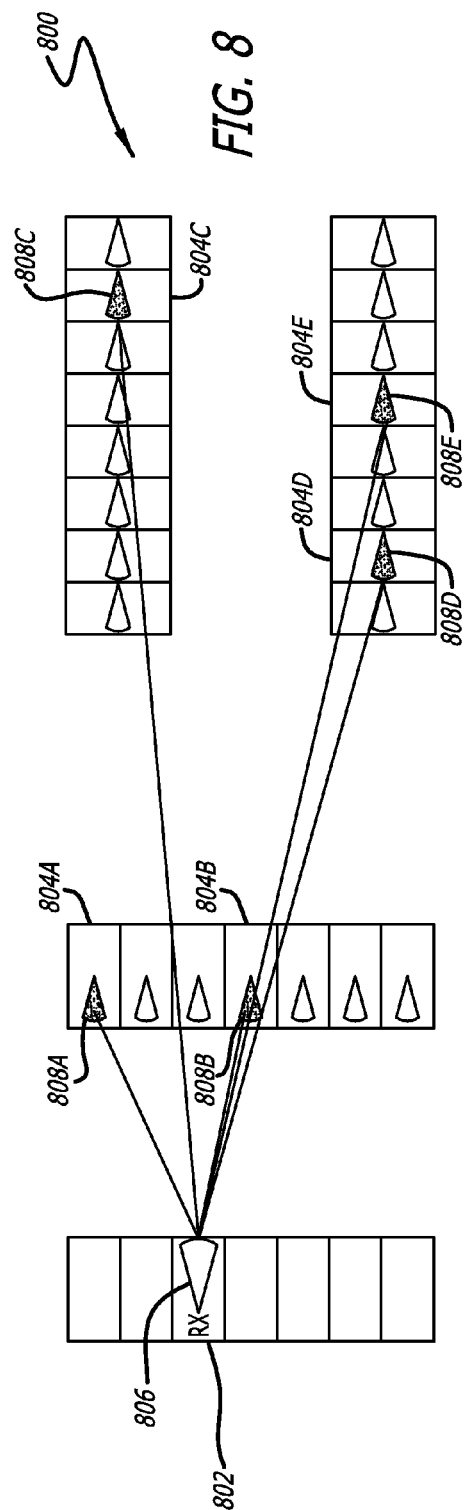

DE-CONGESTING DATA CENTERS WITH WIRELESS POINT-TO-MULTIPOINT FLYWAYS

TECHNICAL FIELD

The present disclosure relates generally to data centers, and more specifically relates to exchanging data traffic among servers.

BACKGROUND

One of the challenges in building large data centers is that the cost of providing the same communication bandwidth between an arbitrary pair of servers grows in proportion to the size of the cluster. In top-of-rack (ToR) architecture used for data centers, the ToR switch that connects a group of servers in a given server rack to other ToR switches and servers may need to exchange data with other ToR switches. However, increasing the utilization of ToRs while preventing debilitating network congestion can be difficult. Since ToRs typically exchange large data volumes with only a few other ToRs in the data center at any given point in time, the sparse nature of the demand matrix may translate to substantial bottlenecks under a conventional data center topology. In other words, as a handful of ToRs lag behind, they can hold back the entire network from completing its tasks.

This implies that it can be costly to scale data centers to accommodate emerging distributed computing applications. As the number of servers, server racks, and other pieces of equipment increases, it becomes more costly and unmanageable to run the data center at a similar performance level.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which:

FIG. 7 illustrates a schematic diagram of an example data center performing a DL-MU-MIMO transmission among the ToR switches;

FIG. 8 illustrates a schematic diagram of an example data center performing a UL-MU-MIMO transmission among the ToR switches;

DESCRIPTION OF EXAMPLE EMBODIMENTS

Figure 1:
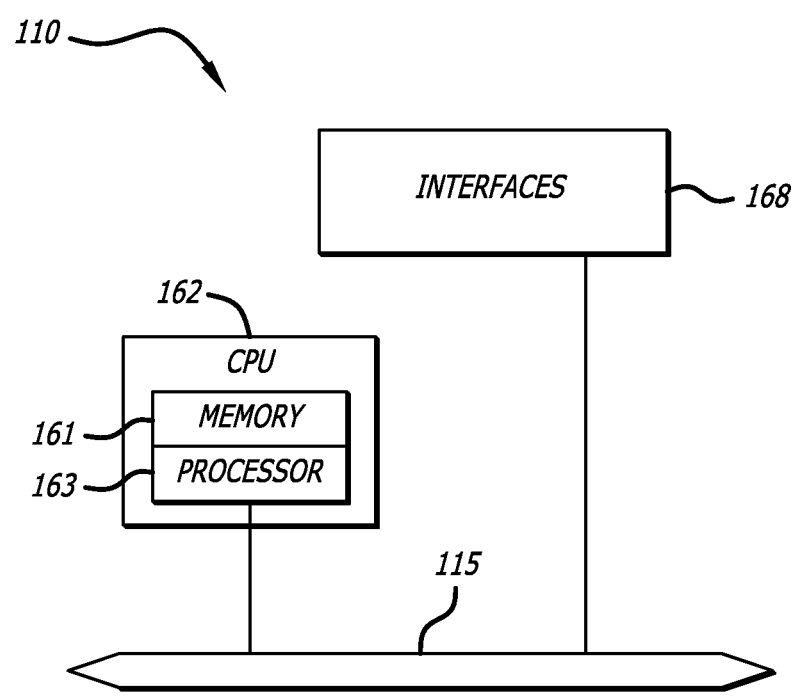
FIG. 1 illustrates an example network device according to some aspects of the subject technology.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Overview

In some embodiments, a source top-of-rack switch (ToR) may identify multiple destination ToR switches from a group of ToR switches to send data traffic to. The source ToR switch may be connected to the group of ToR switches via a base network. The system may determine whether each destination ToR switch is suitable for receiving data transmission via a point-to-multipoint wireless flyway. The two or more destination ToR switches that are determined to be suitable may be considered flyway candidate ToR switches. The system may establish the point-to-multipoint wireless flyway between the source ToR switch and the flyway candidate ToR switches. The system may transmit the data traffic from the source ToR switch to each of the flyway candidate ToR switches via the point-to-multipoint wireless flyway.

In some other embodiments, the system may identify multiple source ToR switches, each of them having respective data to transmit to a destination ToR switch. The source ToR switches and the destination ToR switch may belong to a group of ToR switches that are interconnected to each other via a wired base network. Based on respective channel state information (CSI) received from each of the source ToR switches, the system may select two or more flyway candidate ToR switches from the source ToR switches. The flyway candidate ToR switches may have a beam-forming coefficient that satisfies a threshold value. The system may establish the multipoint-to-point wireless flyway between the flyway candidate ToR switches and the destination ToR switch. The destination ToR switch may then receive respective data symbols from the flyway candidate ToR switches via the multipoint-to-point wireless flyway.

Description

A computer network is a geographically distributed collection of nodes interconnected by communication links and segments for transporting data between endpoints, such as personal computers and workstations. Many types of networks are available, with the types ranging from local area networks (LANs) and wide area networks (WANs) to overlay and software-defined networks, such as virtual extensible local area networks (VXLANs).

LANs typically connect nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), or synchronous digital hierarchy (SDH) links. LANs and WANs can include layer 2 (L2) and/or layer 3 (L3) networks and devices.

The Internet is an example of a WAN that connects disparate networks throughout the world, providing global communication between nodes on various networks. The nodes typically communicate over the network by exchanging discrete frames or packets of data according to predefined protocols, such as the Transmission Control Protocol/Internet Protocol (TCP/IP). In this context, a protocol can refer to a set of rules defining how the nodes interact with each other. Computer networks may be further interconnected by an intermediate network node, such as a router, to extend the effective "size" of each network.

Figure 2A:
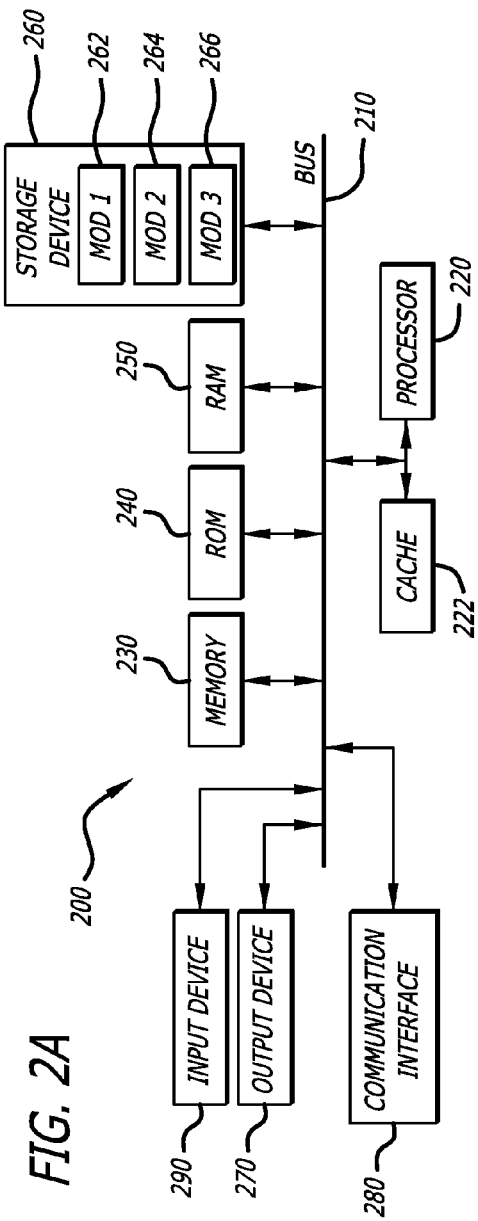
FIGS. 2A-B illustrate example system embodiments according to some aspects of the subject technology.
Figure 2B:
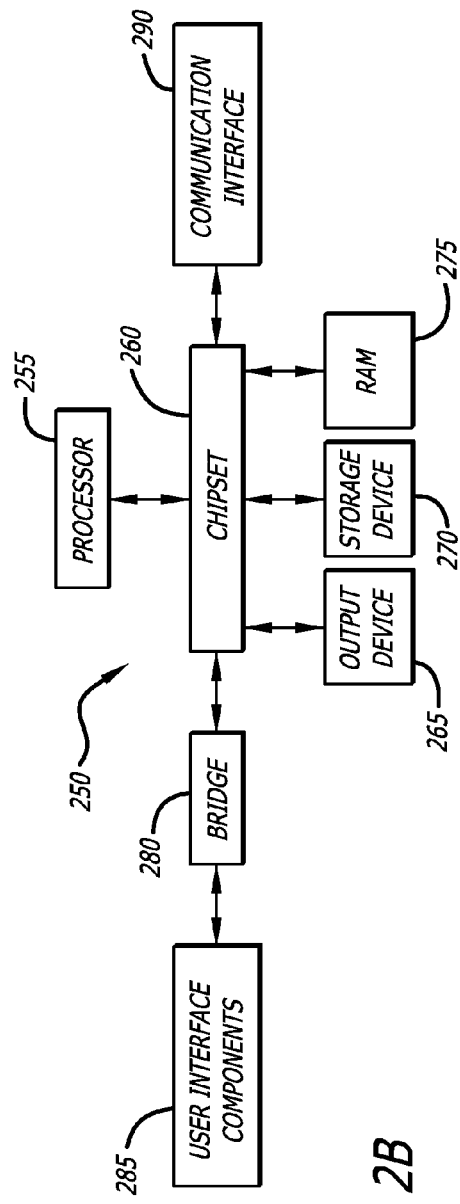

The disclosed technology addresses the need in the art for managing data centers. Disclosed are systems, methods, and computer-readable storage media for de-congesting data centers with wireless flyways, specifically point-to-multipoint flyways and/or multipoint-to-point flyways. A brief introductory description of exemplary systems and networks, as illustrated in FIGS. 1, 2A, and 2B, is disclosed herein. A detailed description of point-to-multipoint and multipoint-to-point wireless flyways, related concepts, and exemplary variations, will then follow. These variations shall be described herein as the various embodiments are set forth. The disclosure now turns to FIG. 1.

FIG. 1 illustrates example network device 110 suitable for implementing the present invention. Network device 110 includes master central processing unit (CPU) 162, interfaces 168, and bus 115 (e.g., a PCI bus). When acting under the control of appropriate software or firmware, CPU 162 is responsible for executing packet management, error detection, and/or routing functions, such as mis-cabling detection functions, for example. CPU 162 preferably accomplishes all these functions under the control of software including an operating system and any appropriate applications software. CPU 162 may include one or more processors 163 such as a processor from the Motorola family of microprocessors or the MIPS family of microprocessors. In an alternative embodiment, processor 163 is specially designed hardware for controlling the operations of router 110. In a specific embodiment, memory 161 (such as non-volatile RAM and/or ROM) also forms part of CPU 162. However, there are many different ways in which memory could be coupled to the system.

Interfaces 168 are typically provided as interface cards or network interface controllers (NICs). Generally, they control the sending and receiving of data packets over the network and sometimes support other peripherals used with the router 110. Among the interfaces that may be provided are Ethernet interfaces, frame relay interfaces, cable interfaces, DSL interfaces, token ring interfaces, and the like. In addition, various very high-speed interfaces may be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. The independent processors may control such communications intensive tasks as packet switching, media control and management. By providing separate processors for the communications intensive tasks, these interfaces allow master microprocessor 162 to efficiently perform routing computations, network diagnostics, security functions, etc.

Although the system shown in FIG. 1 is one specific network device of the present invention, it is by no means the only network device architecture on which the present invention can be implemented. For example, an architecture having a single processor that handles communications as well as routing computations, etc. is often used. Further, other types of interfaces and media could also be used with the router.

Regardless of the network device's configuration, it may employ one or more memories or memory modules (including memory 161) configured to store program instructions for the general-purpose network operations and mechanisms for roaming, route optimization and routing functions described herein. The program instructions may control the operation of an operating system and/or one or more applications, for example. The memory or memories may also be configured to store tables such as mobility binding, registration, and association tables, etc.

FIG. 2A and FIG. 2B illustrate example system embodiments. The more appropriate embodiment will be apparent to those of ordinary skill in the art when practicing the present technology. Persons of ordinary skill in the art will also readily appreciate that other system embodiments are possible.

FIG. 2A illustrates a conventional system bus computing system architecture 200 wherein the components of the system are in electrical communication with each other using a bus 205. Example system 200 includes a processing unit (CPU or processor) 210 and a system bus 205 that couples various system components including the system memory 215, such as read only memory (ROM) 220 and random access memory (RAM) 225, to the processor 210. The system 200 can include a cache of high-speed memory connected directly with, in close proximity to, or integrated as part of the processor 210. The system 200 can copy data from the memory 215 and/or the storage device 230 to the cache 212 for quick access by the processor 210. In this way, the cache can provide a performance boost that avoids processor 210 delays while waiting for data. These and other modules can control or be configured to control the processor 210 to perform various actions. Other system memory 215 may be available for use as well. The memory 215 can include multiple different types of memory with different performance characteristics. The processor 210 can include any general purpose processor and a hardware module or software module, such as module 1 (232), module 2 (234), and module 3 (236) stored in storage device 230, configured to control the processor 210 as well as a special-purpose processor where software instructions are incorporated into the actual processor design. The processor 210 may essentially be a completely self-contained computing system, containing multiple cores or processors, a bus, memory controller, cache, etc. A multi-core processor may be symmetric or asymmetric.

To enable user interaction with the computing device 200, an input device 245 can represent any number of input mechanisms, such as a microphone for speech, a touch-sensitive screen for gesture or graphical input, keyboard, mouse, motion input, speech and so forth. An output device 235 can also be one or more of a number of output mechanisms known to those of skill in the art. In some instances, multimodal systems can enable a user to provide multiple types of input to communicate with the computing device 200. The communications interface 240 can generally govern and manage the user input and system output. There is no restriction on operating on any particular hardware arrangement and therefore the basic features here may easily be substituted for improved hardware or firmware arrangements as they are developed.

Storage device 230 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 225, read only memory (ROM) 220, and hybrids thereof.

The storage device 230 can include software modules 232, 234, 236 for controlling the processor 210. Other hardware or software modules are contemplated. The storage device 230 can be connected to the system bus 205. In one aspect, a hardware module that performs a particular function can include the software component stored in a computer-readable medium in connection with the necessary hardware components, such as the processor 210, bus 205, display 235, and so forth, to carry out the function.

FIG. 2B illustrates a computer system 250 having a chipset architecture that can be used in executing the described method and generating and displaying a graphical user interface (GUI). Computer system 250 is an example of computer hardware, software, and firmware that can be used to implement the disclosed technology. System 250 can include a processor 255, representative of any number of physically and/or logically distinct resources capable of executing software, firmware, and hardware configured to perform identified computations. Processor 255 can communicate with a chipset 260 that can control input to and output from processor 255. In this example, chipset 260 outputs information to output 265, such as a display, and can read and write information to storage device 270, which can include magnetic media, and solid state media, for example. Chipset 260 can also read data from and write data to RAM 275. A bridge 280 for interfacing with a variety of user interface components 285 can be provided for interfacing with chipset 260. Such user interface components 285 can include a keyboard, a microphone, touch detection and processing circuitry, a pointing device, such as a mouse, and so on. In general, inputs to system 250 can come from any of a variety of sources, machine generated and/or human generated.

Chipset 260 can also interface with one or more communication interfaces 290 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by processor 255 analyzing data stored in storage 270 or 275. Further, the machine can receive inputs from a user via user interface components 285 and execute appropriate functions, such as browsing functions by interpreting these inputs using processor 255.

It can be appreciated that example systems 200 and 250 can have more than one processor 210 or be part of a group or cluster of computing devices networked together to provide greater processing capability.

Figure 3:
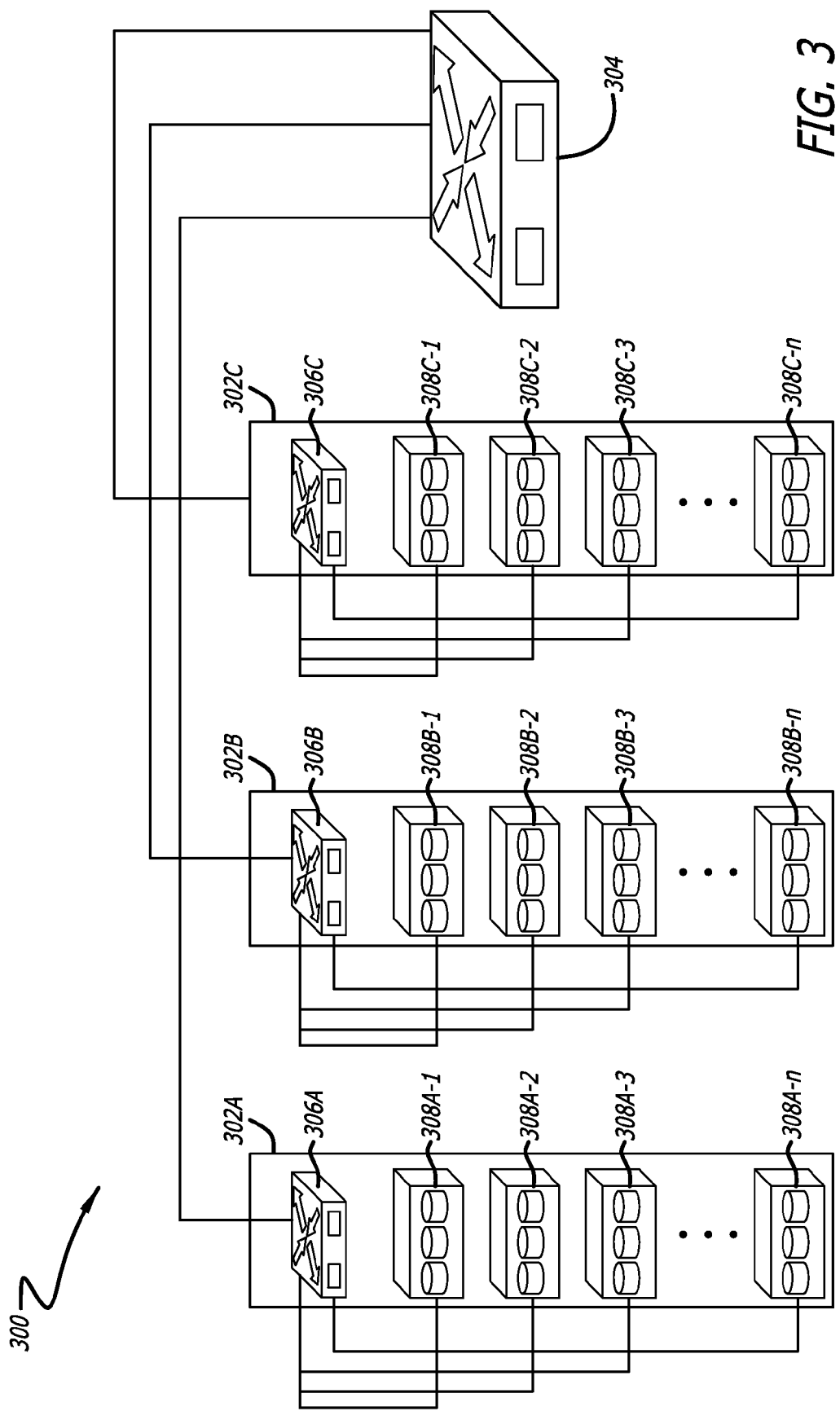
FIG. 3 illustrates a schematic block diagram of an example network architecture for a data center.

FIG. 3 illustrates a schematic block diagram of an example network architecture for a data center. Although example architecture 300 will be described as a top-of-rack (ToR) architecture, the disclosed embodiments can be practiced just as readily with other types of data center architecture such as end-of-row (EoR) or middle-of-row (MoR) topologies. Racks 302A, 302B, 302C (collectively "302") may house multiple types and instances of computing device modules such as switches, servers, storage equipment, etc. For example, rack 302A may consist of multiple servers 308A-1, 308A-2, 308A-3, . . . , 308A-n connected to top-of-rack (ToR) switch 306A via relative short copper and/or fiber-optic cabling. Similarly, rack 302B may have servers 308B-1, 308B-2, 308B-3, . . . , 308B-n connected to ToR 306B while rack 302C may house servers 308C-1, 308C-2, 308C-3, . . . , 308C-n and ToR 306C.

One of ordinary skill in the art will understand that a ToR (i.e., ToR switch) does not necessarily need to be physically located at the "top" of a rack, but it can be placed anywhere inside or outside the rack as long as it has direct connectivity to other modules in the rack. One of skill in the art will also understand that, although FIG. 3 depicts three server racks 302, a data center may have any number of server racks or cabinets, arranged in one or more rows or columns or in any other layout. In turn, ToR switches 306A, 306B, 306C (collectively "306") can be connected to aggregation switch 304 typically via fiber-optic cabling. Aggregation switch 304 may be connected to other aggregation switches or the rest of the network such as LAN, WAN, etc. (not shown).

Figure 4:
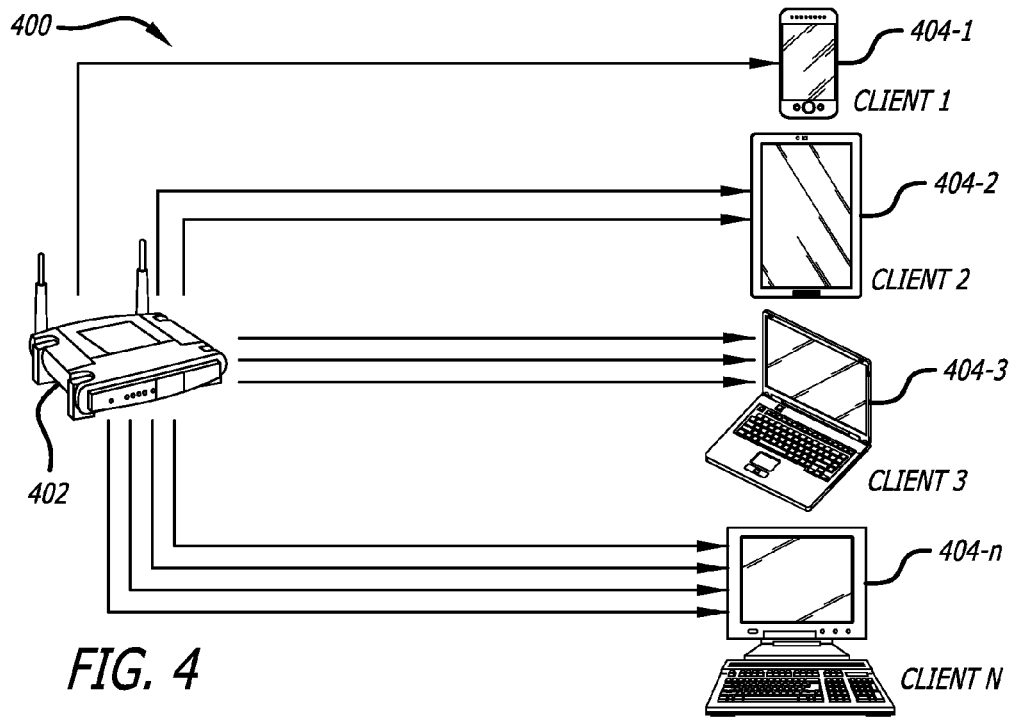
FIG. 4 illustrates a schematic diagram of an example MU-MIMO network.

FIG. 4 illustrates a schematic diagram of an example MU-MIMO network. In example wireless network 400, access point (AP) 402 can establish wireless links with one or more client devices such as client 1 (404-1), client 2 (404-2), client 3 (404-3), . . . and client N (404-n) (collectively "404"). AP 402 and clients 404 are equipped with transceivers capable of transmitting and receiving RF signals. AP 402 and clients 404 can transmit and receive radio frequency (RF) signals to and from each other to exchange data symbols. In some embodiments, the transmitter and the receiver can use just a single antenna while in some other embodiments, they can use two or more antennas, thus achieving a multiple-input multiple-output (MIMO) link. When the MIMO link is between a single multi-antenna transmitter and a single multi-antenna receiver, the link is considered a single-user MIMO (SU-MIMO) link. MIMO is an integral part of many wireless communication standards such as Institute of Electrical and Electronics Engineers (IEEE) 802.11n (Wi-Fi), IEEE 802.11ac (Wi-Fi), Evolved High-Speed Packet Access (HSPA+) (3G), Worldwide Interoperability for Microwave Access (WiMAX) (4G), and Long Term Evolution (LTE) (4G), and other standards currently in development.

When MIMO is employed, multiple RF signals can be bundled up by way of constructive interference by performing a digital signal processing technique called "beam-forming," which is also known as spatial filtering. The process of beam-forming modulates the data symbols into RF signals suited for transmission over a particular wireless channel between a transmitter and a receiver. The resulting "beam" is a directional signal that is generated by the transmitter and directed at the receiver. Since beam-forming can dynamically adapt to the conditions and attributes of the particular communication channel, the fidelity of the communication link between the transmitter and the targeted receiver can be improved. Where there are two more or more receivers, each receiver's wireless channel with the transmitter can be different. In other words, the transmitter can establish multiple wireless channels, each channel dedicated for each of the receivers. According to each channel's characteristics, the transmitter may also modulate multiple receivers' data symbols together into one set of RF signals to be sent out concurrently. Then, even though the resulting RF signal contains data symbols for multiple receivers, each targeted receiver can still decode its data symbols. Such technique of combining multiple RF signals, as shown in FIG. 4, is called multi-user MIMO (MU-MIMO), where there may be two or more multi-antenna transmitters or two or more multi-antenna receivers.

Specifically, when the MU-MIMO configuration occurs in the downlink (i.e., from one transmitter to two or more receivers), it is considered a point-to-multipoint link, or downlink multi-user multiple-input and multiple-output (DL-MU-MIMO). Similar technique can be applied in the uplink when clients 404 are cognizant of the wireless channels between them and AP 402, such that multiple clients' 404 data symbols are transmitted concurrently on the uplink direction to AP 402. This is known as a multi-point-to-point link, or uplink multi-user multiple-input and multiple-output (UL-MU-MIMO).

Figure 5:
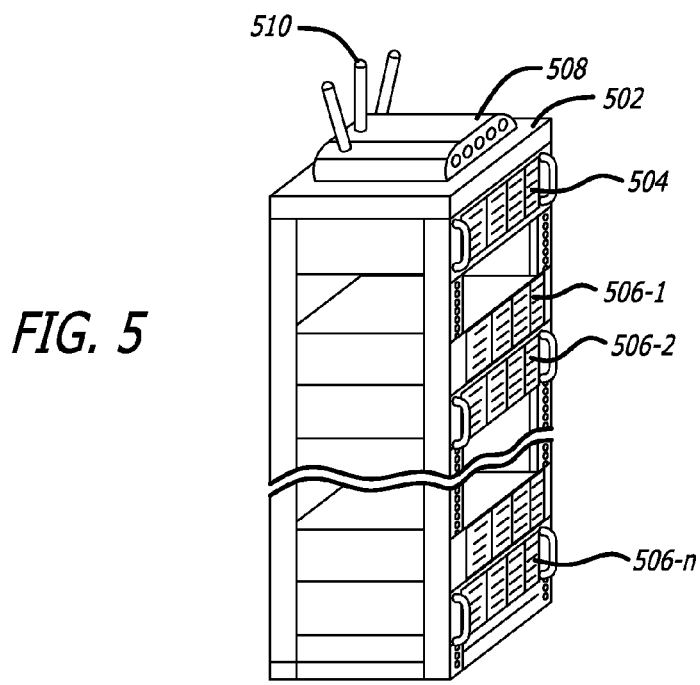
FIG. 5 illustrates an example server rack coupled with a wireless transceiver.

FIG. 5 illustrates an example server rack coupled with a wireless transceiver. Server rack 502 may be an enclosure for mounting multiple equipment modules such as ToR switch 504 and blade servers 506-1, 506-2, . . . , 506-n (collectively "506"). Rack 502, ToR switch 504, and servers 506 may each correspond to rack 302A, ToR switch 306A, and servers 308A previously shown in FIG. 3. Servers 506 may be connected to switch 504 via copper and/or fiber-optic cabling (not shown). Switch 504 may in turn be connected to the rest of the network through another piece of equipment such as an aggregation switch (not shown). In addition, ToR switch 504 may be connected to wireless transceiver 508. Wireless transceiver 508 may be capable of establishing MU-MIMO links with one or more other wireless transceivers, which can be connected to their respective ToR switches. Thus, wireless transceiver 508 may utilize its antenna(s) 510 to establish point-to-multipoint or multi-point-to-point ToR flyways, as will be described in detail later.

Figure 6:
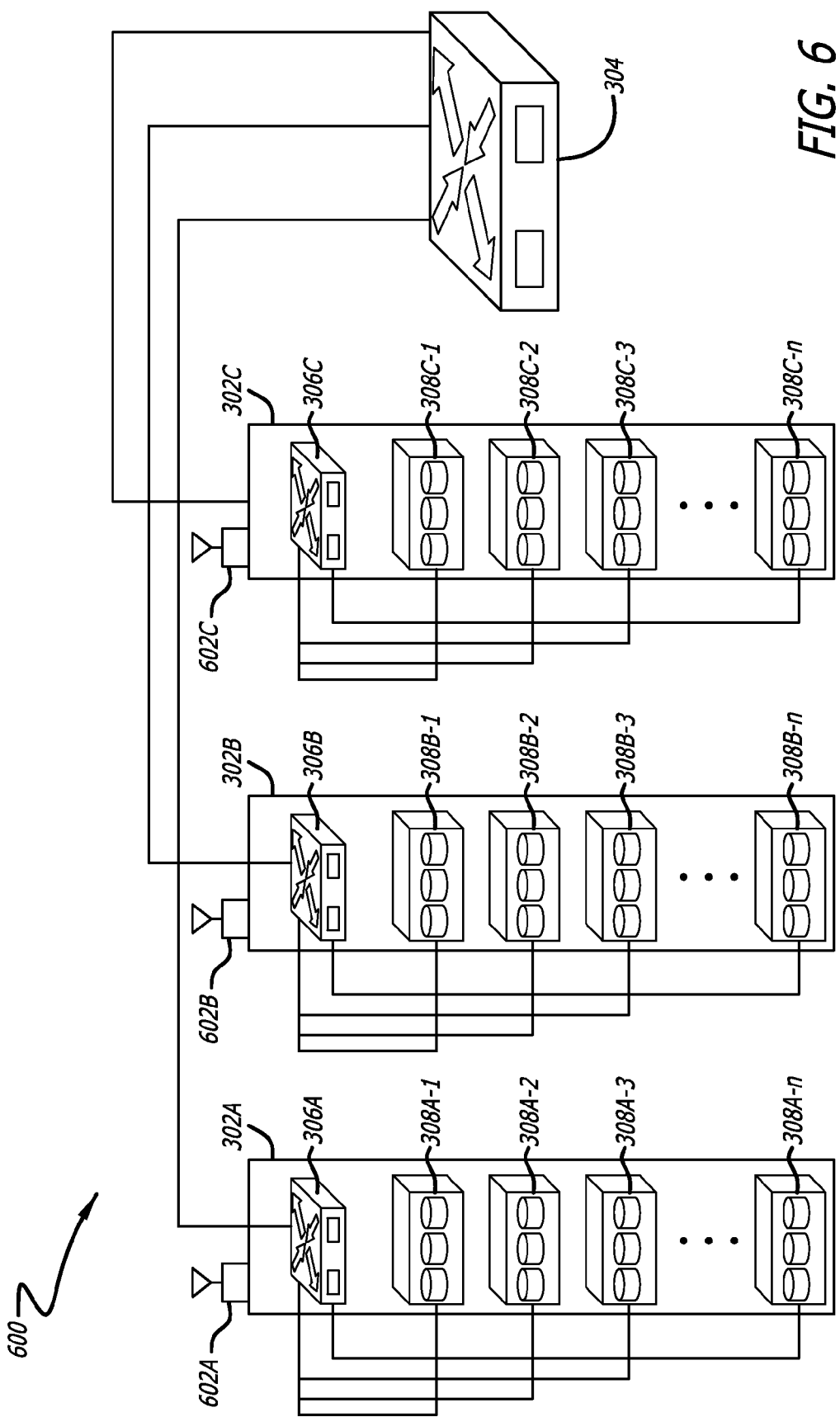
FIG. 6 illustrates a schematic block diagram of an example configuration for a data center augmented by wireless flyways.

FIG. 6 illustrates a schematic block diagram of an example configuration for a data center augmented by wireless flyways. Similar to data center configuration 300 shown in FIG. 3, data center configuration 600 may consist of racks 302, aggregation switch 304, ToR switches 306, and servers 308, which are interconnected to each other through wired cabling such as copper and/or fiber. The wired network, then, can provide the base network for servers 308. In other words, when one server or group of servers within data center 600 needs to exchange data with another server or group of servers, it may do so via the base network.

However, since the data transmission demands of servers 308 may fluctuate over time, the data traffic may experience spikes that cause congestion in the base network. Such spikes may occur only infrequently but when they do occur, it can significantly affect the performance of the network and even bring down the entire network temporarily. However, it would be inefficient and costly to design the whole distributed computing system around the peak traffic because during non-peak hours (i.e., majority of the time), much of the equipment would be kept idle. This problem can become more pronounced as the distributed network grows in size. Thus, data centers can greatly benefit from a dynamic deployment of flyways that can temporarily yet effectively alleviate data congestion and improve overall performance of the network by providing extra capacity to connect just a few ToR switches at a time. Flyways are wired or wireless links that are set up on demand or commodity switches that interconnect random subsets of the ToR switches. Specifically, transceivers capable of MU-MIMO data transmissions can establish wireless flyways to supplement the existing wired base network. This wired/wireless hybrid approach allows the designers of the data center to provision the network based on the average demand scenario instead of oversubscribing the network with excess equipment.

Accordingly, ToR switches 306 may be respectively coupled with wireless transceivers 602A, 602B, 602C (collectively "602"). The flyways may utilize a particular frequency or a range of frequencies in the allotted frequency spectrum. For example, transceiver 508 may implement MU-MIMO channels in the 60 GHz frequency band to establish point-to-multipoint or multipoint-to-point flyways. Due to the high attenuation at the 60 GHz band, such links are typically short range (e.g., 1-10 meters) suitable for the typical distance between ToRs in a data center. Moreover, since a channel can be up to a few gigahertz wide, it can support high-bandwidth data transfer of 1 Gbps or higher. Accordingly, in addition to the wired base network, ToR switches 306 can wirelessly route data to and from servers 308 through transceivers 602. For example, when server 308A-3 suddenly finds itself in need of transferring to servers 308B-1, 308C-2, and 308C-3 a large amount of data in excess of the data transmission capabilities of the base network, rather than placing an undue stress on the wired base network and thereby causing congestion, ToR switch 306A can use its transceiver 602A to reroute the excess traffic wirelessly by establishing a point-to-multipoint DL-MU-MIMO flyway with transceivers 602B and 602C. Conversely, as an example, when multiple servers 308A-3, 308C-1, 308C-2 need to send data to server 308B-2, ToR switches 306A, 306C and transceivers 602A, 602C can establish a multipoint-to-point wireless flyway to ToR 306B and transceiver 602B to perform a UL-MU-MIMO wireless transmission.

In order to modulate signals according to a particular wireless channel, the properties and characteristics of the channel have to be known, typically ahead of time. These known channel properties are referred to as channel state information (CSI) and collectively they describe how a particular signal may propagate from the transmitter to the receiver. These channel properties may include fading, scattering, decay, type of fading distribution, average channel gain, line-of-sight component, spatial correlation, etc. Other attributes may include frequency, the relative speed at which the transmitter and/or receiver is moving, and whether there are obstructions along or near the transmission path. The various properties of the wireless channel can be measured instantaneously at discrete moments or statistically over an extended period of time. The CSI may be obtained by exchanging training signals between the transmitter and the receiver. In MU-MIMO, a set of CSI may be obtained for each wireless channel, for example, between the transmitter and each of the multiple receivers. Since the conditions and properties of a wireless channel may fluctuate over time, depending on the wireless environment, propagation medium, etc., training may have to be performed frequently.

For example, in an exemplary data center environment with wireless transmitters operating at the 60 GHz frequency, which is relatively high, the properties and attributes of the wireless channels may vary only slightly. Moreover, because the locations of the ToR switches are typically fixed and there are no moving objects near the ceiling to obstruct a line of sight, one may expect the channels to be nearly static. The relatively stable conditions of the data center may translate to no or infrequent needs for performing training to update the CSI for a given wireless communications channel.

Although data center 600 is illustrated in terms of ToR switches 602 and ToR architecture, one of skill in the art will understand that disclosed embodiments can also apply to other types of data centers. For example, transceivers 602 may be attached to EoR or MoR switches to establish similar wireless links that complement the base network.

FIG. 7 illustrates a schematic diagram of an example data center performing a DL-MU-MIMO transmission among the ToR switches. In FIG. 7, exemplary data center 700 is shown in a top-down view, where server racks are arranged in four rows with seven racks in each row. Server rack 702 and server racks 704A, 704B, 704C, 704D, 704E (collectively "704") are also shown as part of data center 700. This configuration, however, is merely exemplary and one of skill in the art will understand that other configurations with fewer or more server racks are also possible. Racks 702, 704 may be similar to other racks previously shown in FIGS. 5 and 6. As such, racks 702, 704 may house therein switches, servers, and/or other modular equipment, and be interconnected through a wired base network (not shown). Thus, in this description, racks 702, 704 may also be referred to as ToR switches 702, 704. ToRs 702, 704 may be also equipped with transceivers and antennas 706 and 708A, 708B, 708C, 708C, 708D, 708E (collectively "708") for establishing wireless links and flyways. The transceivers may be, for example, 60 GHz MU-MIMO transceivers connected to their respective ToR switches. One of skill in the art, however, will realize that transceivers 706, 708 may transmit and receive signals at a radio frequency or band of radio frequencies other than 60 GHz.

Antennas 706, 708 can be positioned and oriented in such a way to maximize their abilities to transmit and receive radio signals. In one example, antenna 706 can be positioned in the general direction of other transceivers such that it can achieve better communication performance. In some embodiments, the positions and directions of antennas 706, 708 can be adjusted manually or automatically. Transceivers and antennas 706, 708 may also periodically exchange relevant CSI among each other such that, should there be a need, a flyway may be created at a moment's notice.

In this example, ToR 702 has data traffic queued up to be sent to multiple other ToRs 704. ToR 702, ToRs 704, or another central controlling device (not shown) may determine that transmitting the data traffic to ToRs 704 may overwhelm the base network or otherwise congest the network above a predetermined threshold. Thus, ToR 702, ToRs 704, or the central controlling device may decide to send the traffic via a point-to-multipoint flyway instead. In order to establish the wireless flyway, ToR 706 may examine destination ToRs 704 and determine whether any of them are within range of its 60 GHz transceiver 706. For example, ToR 706 may determine that ToRs 704A, 704B, 704C, 704D are well within the range that would guarantee the predetermined minimum threshold signal strength for the wireless channels between ToR 706 and each of ToRs 704A, 704B, 704C, 704D, but rule out ToR 704E because it is too far away from ToR 702. For those destination ToRs that are not in range, ToR 702 can rely on the base network to route the data traffic.

On the other hand, for those destination ToRs that are within range, ToR 702, ToRs 704, or the central controlling device may consider whether the CSI between ToR 702 and each of the destinations is up to date (i.e., last updated within the past X seconds, where X is a configurable parameter; for example, X=50 ms). In a data center that is more or less static and does not involve too many moving components, the update frequency can be relatively low while the more dynamic data center with frequent changes to its configuration and layout may call for more frequent CSI updates. For those destination ToRs with outdated CSI, ToR 702 can route their data traffic by the base network or let the data traffic remain in the transmission queue until the appropriate CSI is updated in the next scheduled training session. Alternatively, ToR 702 may initiate another training session immediately to update the necessary CSI for the outdated ToRs.

Now, for those destination ToRs with up-to-date CSI, ToR 702, transceiver 706, or the central controlling device may select the first Y destinations (where Y is a configurable parameter and Y>1) in the queue and calculate, based on their respective CSI, a beam-forming coefficient to be applied to data symbols for generating the RF signals. Y may depend on the number of antennas available in each multi-antenna transceiver. For example, Y may be 4. If the calculation shows that the resulting beam-forming is sub-optimal (i.e. fails to effectively use the available wireless spectrum and spatial diversity), ToR 702, transceiver 706, or the central controlling device may select other destination ToRs that are further down in the queue. In turn, ToR 702 may route the data traffic that was destined for the unfit candidate ToRs through the base network instead.

Once the Y candidate destination ToRs are selected, vetted, and finalized, transceiver 706 can transmit an RF signal via MU-MIMO to selected Y destination ToRs 704A, 704B, 704C, 704D. The RF signal can be generated by precoding and/or spatial multiplexing according to the CSI collected from destination ToRs. Each destination ToR may receive the RF signal and decode from it the data symbols intended for the respective destination ToR.

The wireless flyways may also interoperate with the rest of data center's 700 network (i.e., base network) to route and forward data packets. Such operations may occur via the control plane at Layer 3. Since an MU-MIMO flyway is not a symmetric link (i.e., it is either uplink or downlink), when transceiver 706 transmits to multiple destination ToRs 708A, 708B, 708C, 708D, the link is unidirectional. This is because the destination ToRs can typically only operate in receive mode once the link is established and cannot transmit back to ToR 706. However, most network communication protocols require that the end hosts (e.g., servers) exchange control packets, such as an acknowledgement (ACK) packet to signal successful receipt of data. Thus, destination ToRs 708A, 708B, 708C, 708D require reverse channels (also called "reverse communications paths") that lead back to ToR 702 such that the destination ToRs can route any control packets transmitted by any destination hosts back to the source host via source ToR 706.

In some embodiments, destination ToRs 708A, 708B, 708C, 708D may first terminate the established point-to-multipoint MIMO link and then establish another link in the opposite direction to transmit data such as the control packets back to ToR 702. However, this approach can be costly because of the overhead involved in establishing and terminating multiple links in succession. Thus, in some other embodiments, ToRs may omit setting up such reverse channels during a point-to-multipoint MIMO transmission such that ToR 702 can simply "blast" away at high bandwidth on the 60 GHz link in one direction without needing to stop and re-establish links periodically. Instead, ToRs 702, 704 may utilize the existing wired base network for reverse channel transmissions. That is, in addition to having a wireless interface, each ToR may also have access to the wired network such as Ethernet via copper and/or fiber cabling. Since the wired links in the base network are bi-directional, when a given destination ToR is due for sending control packets (or in some cases a small amount of data packets) back to ToR 702, the destination ToR may do so by sending the packets through data center's 700 wired network, which would then route the packets to ToR 702. Since control packets are typically small or even negligible in size, they would not create any congestion in the wired network and they can be routed to ToR 702 expeditiously. By employing a bi-directional channel emulation scheme such as UniDirectional Link Routing (UDLR), from the viewpoint of the network's Layer-3 routing mechanism, it is possible to make the underlying wireless paths appear as though they have a reverse path through the wireless link when in fact the reverse traffic would actually traverse the wired links. Thus, ToRs 702, 704 may achieve point-to-multipoint MIMO connectivity without the need for terminating the wireless link currently in session. Diverting the reverse traffic can be accomplished by tunneling any packets for a flow carried on the MU-MIMO channel that arrive at ToR 704. That is, a packet can be encapsulated with ToR 704 as the source and ToR 702 as the destination, and the route from ToR 704 to ToR 702 can be set to a next hop router on the wired network. Alternatively, data center 700 can insert a "source route" in a packet in the reverse traffic where the source route explicitly points the packet to a next hop on the wired network. Other routing methods may be possible. For example, data center 700 can use a software defined network (SDN) controller to directly program the data plane of the wired switches to ensure that packets for a flow carried on the MU-MIMO channel arriving at ToR 704 whose next hop would normally be ToR 702 go through a series of switches on the wired network.

As a corollary, as Layer 3 becomes aware of the potential point-to-multipoint data path patterns that can offer additional high bandwidths, Layer 3 may establish point-to-multipoint MIMO flyways that not only do not interfere with each other, but also optimize total overall network capacity. In addition, since the wireless flyways that have been set up now appear to Layer 3 as symmetric (i.e., having a reverse channel), the high-bandwidth forward paths can continue to operate without interference until the data flow is complete. When the point-to-multipoint flow pattern changes afterwards, the control plane at Layer 3 may only need to modify the forwarding information bases (FIBs) accordingly. The aforementioned concurrent point-to-multipoint MIMO data flows can improve the overall capacity of the network over dynamically occurring traffic patterns. Furthermore, by utilizing the wireless flyways, the network topology becomes more fluid and dynamic compared to the fixed network topology of the conventional wired data centers. Although this hybrid wired/wireless approach is described in terms of a point-to-multipoint MU-MIMO transmission as illustrated in FIG. 7, it may also apply to multipoint-to-point MU-MIMO transmissions as shown in FIG. 8.

FIG. 8 illustrates a schematic diagram of an example data center performing a UL-MU-MIMO transmission among the ToR switches. As with FIG. 7, exemplary data center 800 is shown in a top-down view, where server racks are arranged in rows and columns. Server rack 802 (or alternatively ToR 802) and server racks 804A, 804B, 804C, 804D, 804E (or alternatively ToRs 804A, 804B, 804C, 804D, 804E) (collectively "804") are also shown as part of data center 800. This configuration, however, is merely exemplary and one of skill in the art will understand that other configurations with fewer or more server racks and switches are also possible. Racks 802, 804 may be similar to other racks previously shown in FIGS. 5-7. As such, racks 802, 804 may house therein switches, servers, and/or other modular equipment, interconnected through a wired base network (not shown). ToRs 802, 804 may be equipped with transceivers and antennas 806 and 808A, 808B, 808C, 808C, 808D, 808E (collectively "808") for establishing wireless links and flyways. The transceivers may be, for example, 60 GHz MU-MIMO transceivers connected to their respective ToR switches. One of skill in the art, however, will realize that transceivers 806, 808 may transmit and receive radio signals at different radio frequency or band of radio frequencies.

Antennas 806, 808 can be positioned and adjusted manually or automatically to achieve better communication performance. Transceivers and antennas 806, 808 may also periodically exchange relevant CSI among each other. In this example, multiple ToRs 804 wish to send data to one ToR 802. Destination ToR 802, for example, can be a popular data sink such as a redundant backup server or a job history logger. However, ToRs 804, ToR 802, or a central controlling device (not shown) may determine that transmitting the data traffic from ToRs 804 to ToR 802 through the wired base network may be too burdensome for the base network. Thus, ToRs 804, ToR 802, or the central controlling device may decide that sending the traffic via a wireless flyway would be a better choice instead. Such a flyway can be a multipoint-to-point flyway employing UL-MU-MIMO.

In order to establish the multipoint-to-point flyway, ToRs 804, ToR 802, or the central controlling device may determine whether source ToRs 804 are within range of destination ToR 802. For those source ToRs that are not in range, those ToRs may choose to rely on the base network to route their traffic. For example, in data center 800, it may be determined that ToRs 804C and 804E are actually too far away from the intended destination, ToR 802. Thus, transceivers 808C, 808E may not be able to establish a reliable wireless channel (e.g., having at least the minimum threshold signal strength) with transceiver 806. In such a case, ToRs 804C, 804E may simply use the underlying base network to transmit data to ToR 802.

For those source ToRs that are within range, however, ToRs 804, ToR 802, or the central controlling device may consider whether the CSI between ToR 802 and each of the sources is up to date (i.e., last updated within the past X seconds, where X is a configurable parameter; for example, X=50 ms). The required update frequency may depend on the individual circumstances and characteristics of a given data center. Those source ToRs with outdated CSI may choose to route their data to destination ToR 802 by the base network. Alternatively, they can wait until the next training session to update the latest CSI and then send the data traffic via a flyway.

Once the CSI has been updated, ToRs 804, ToR 802, or the central controlling device may select two or more flyway candidate source ToRs based on their CSI. This can be done by calculating which combination of source ToRs is better at mixing their data symbols to form a UL-MU-MIMO signal. In other words, the system can try to determine which combination of source ToRs may result in a more desirable beam-forming coefficient. Accordingly, ToRs 804, ToR 802, or the central controlling device may select Y number of source ToRs as candidates, where Y is an integer greater than 1. The corresponding beam-forming coefficient may then be applied to each of the Y source ToRs' data symbols and each source ToR may generate an RF signal to transmit. These RF signals may then be combined to form an MU-MIMO wireless link.

Destination ToR 802 can receive the RF signals sent concurrently in the air by the Y source ToRs. Since the data symbols of the respective source ToRs are beam-formed to compose a MU-MIMO signal, destination ToR 802 can separate and decode individual groups of data symbols from each source ToR. Thus, many principles and concepts illustrated in FIG. 8 are similar to those of FIG. 7 but are applied in the reverse direction. As one of ordinary skill in the art will readily recognize, the examples and technologies provided above are simply for clarity and explanation purposes, and can include many additional concepts and variations.

Figure 9:
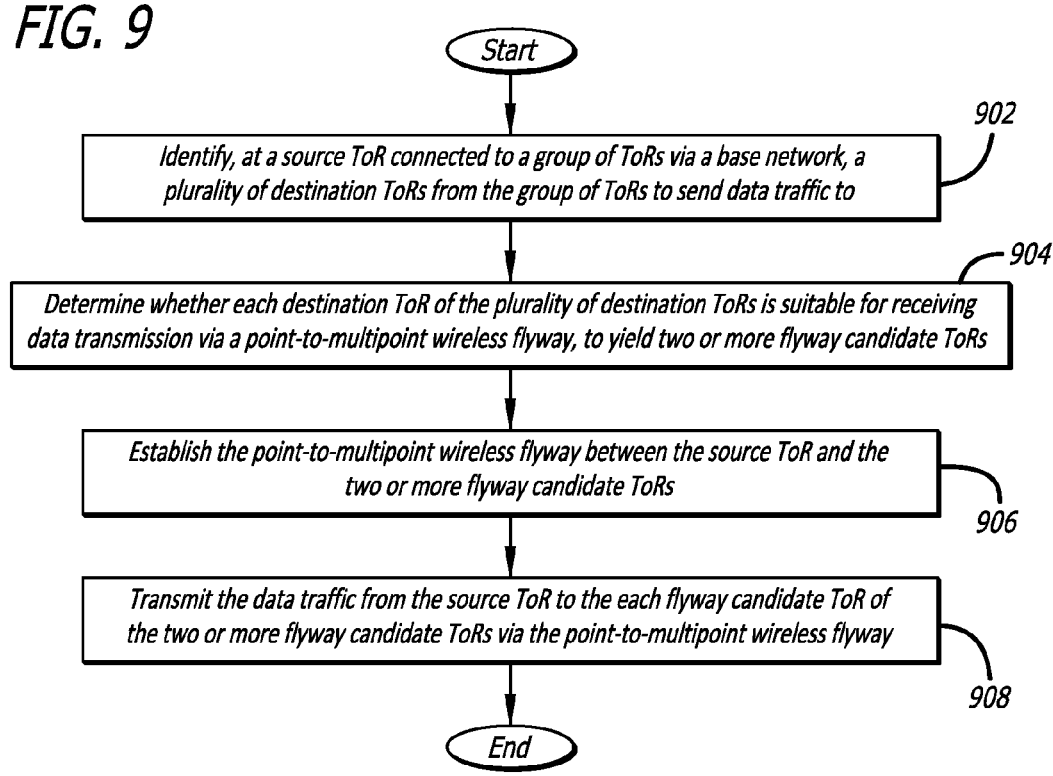
FIG. 9 illustrates an example method embodiment of performing a DL-MU-MIMO transmission.
Figure 10:
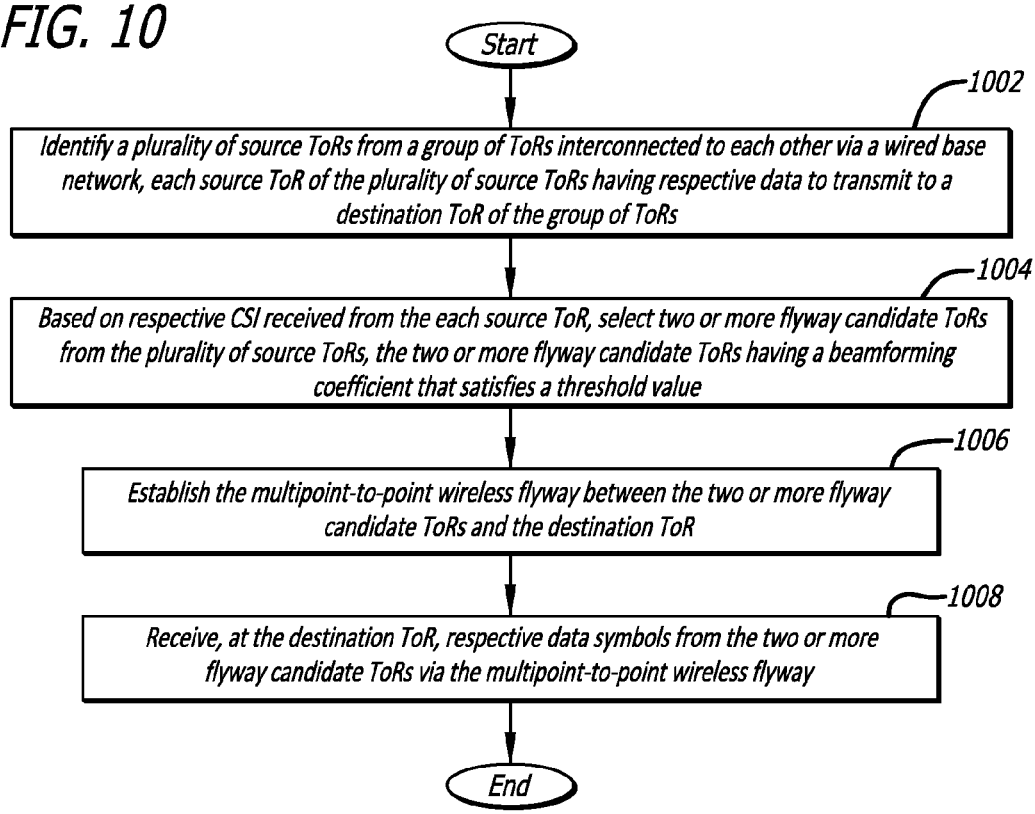
FIG. 10 illustrates an example method embodiment of performing a UL-MU-MIMO transmission.
Figure 11:
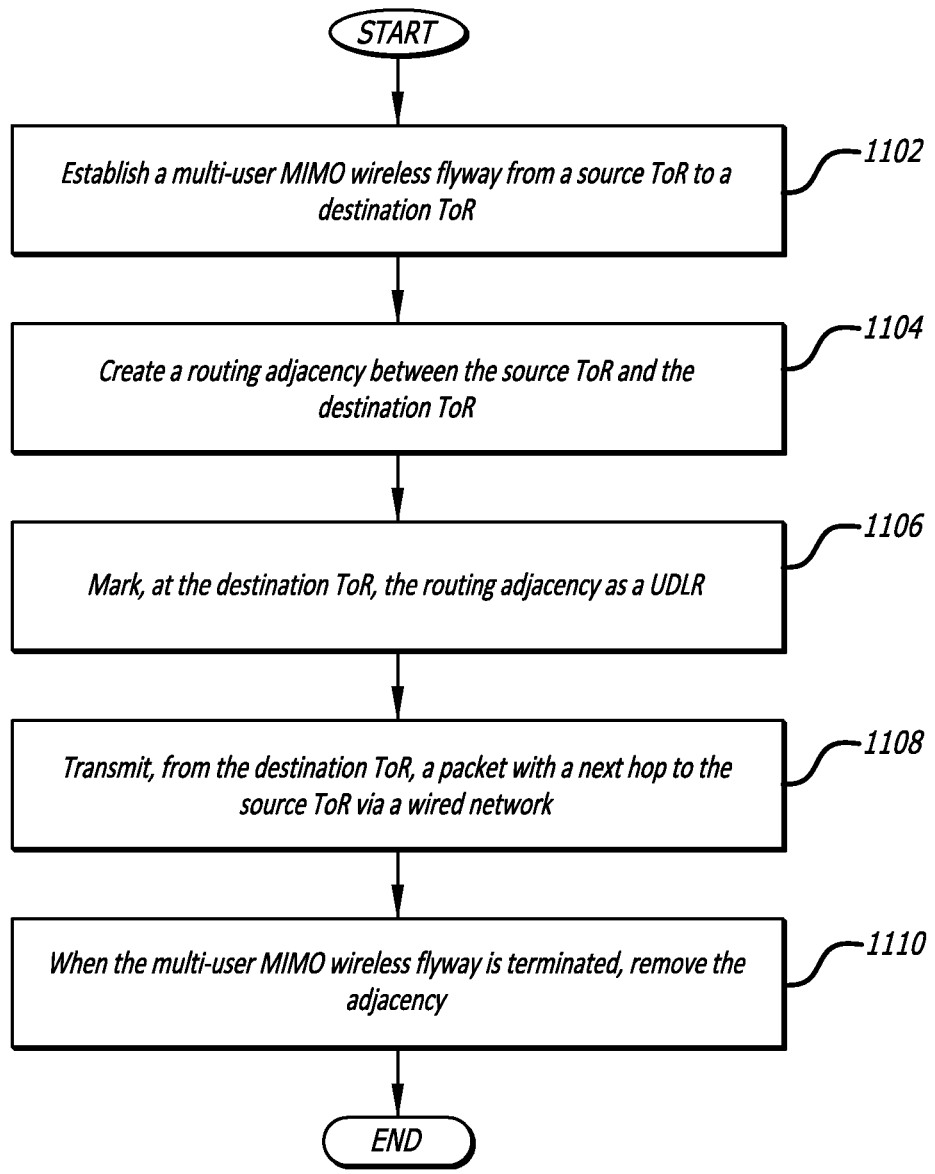
FIG. 11 illustrates an example method embodiment of routing reverse traffic from a destination ToR switch to a source ToR switch.

Having disclosed some basic system components and concepts, the disclosure now turns to the exemplary method embodiments shown in FIGS. 9-11. For the sake of clarity, the methods are described in terms of system 110, as shown in FIG. 1, configured to practice the method. Alternatively, the methods may be practiced by system 200 of FIG. 2A or system 250 of FIG. 2B. The steps outlined herein are exemplary and can be implemented in any combination thereof, including combinations that exclude, add, or modify certain steps. The steps may be practiced in the order shown in FIGS. 9-11 or in any other order. Additionally, the methods illustrated in FIGS. 9-11 may also apply to types of switches other than ToR switches, such as EoR and MoR switches and the like.

FIG. 9 illustrates an example method embodiment of performing a DL-MU-MIMO transmission. System 110 may identify, at a source ToR (also known as top-of-rack switch) connected to a group of ToRs via a base network, a plurality of destination ToRs from the group of ToRs to send data traffic to (902). Each of the ToRs may be placed in a rack and connect to other servers, storage, equipment, etc. in the rack. ToRs may be also connected to an aggregation switch as part of the base network. The base network can be a wired network based on copper and/or fiber-optic cables. System 110 may determine whether each destination ToR of the plurality of destination ToRs is suitable for receiving data transmission via a point-to-multipoint wireless flyway, to yield two or more flyway candidate ToRs (904). This may include determining whether the each destination ToR is within a threshold range of a transceiver associated with the source ToR. When a particular destination ToR is determined to be out of the threshold range of the transceiver, the source ToR can route the data traffic to the particular destination ToR via the base network.

Determining suitability may also include determining whether respective channel state information (CSI) associated with the each destination ToR has been received at the source ToR within a predetermined time in a past. In other words, the determination may be made as to whether the CSI associated with a particular destination ToR is up to date. When CSI associated with a particular destination ToR switch of the plurality of destination ToR switches has not been received at the source ToR switch within the predetermined time in the past, source ToR may route the data traffic to the particular destination ToR switch via the base network. Alternatively, the source ToR may delay transmission of the traffic data to the particular destination ToR switch until updated CSI is received from the particular destination ToR switch. Thus, the two or more flyway candidate ToRs may be selected among the plurality of destination ToRs according to one or more criteria discussed above. The number ToRs in those two or more flyway candidate ToRs can be a tunable parameter that depends on a number of antennas available for establishing the point-to-multipoint wireless flyway. For example, the number antennas available for the source ToR and the number of antennas available for the destination ToRs may influence how many flyway candidate ToRs are chosen.

System 110 may establish the point-to-multipoint wireless flyway between the source ToR and the two or more flyway candidate ToRs (906). This can be accomplished by calculating a beam-forming coefficient based on respective CSI associated with each of the two or more flyway candidate ToR switches. The calculated beam-forming coefficient may then be applied to data symbols for generating an RF signal. However, when the beam-forming coefficient calculated based on the respective CSI fails to meet a threshold condition, a different group of destination ToRs may be selected out of the plurality of destination ToRs as flyway candidate ToRs. The threshold condition may be related to the signal strength, reliability, throughput, etc. of the resulting beam.

System 110 may transmit the data traffic from the source ToR to the each flyway candidate ToR of the two or more flyway candidate ToRs via the point-to-multipoint wireless flyway (908). This may be accomplished by transmitting an RF signal from a transceiver associated with the source ToR switch to a respective transceiver associated with the each flyway candidate ToR switch via a downlink multi-user multiple-input and multiple-output (DL-MU-MIMO) signal. The source ToR may receive a control packet from the each flyway candidate ToR switch via the base network.

FIG. 10 illustrates an example method embodiment of performing a UL-MU-MIMO transmission. System 110 may identify a plurality of source ToRs from a group of ToRs interconnected to each other via a wired base network, each source ToR of the plurality of source ToRs having respective data to transmit to a destination ToR of the group of TORs (1002). Based on respective CSI received from the each source ToR, system 110 may select two or more flyway candidate ToRs from the plurality of source ToRs, the two or more flyway candidate ToRs having a beam-forming coefficient that satisfies a threshold value (1004). The selection of the two or more flyway candidate ToRs may be also performed by determining whether the each source ToR is within a threshold range of a transceiver associated with the destination ToR.

System 110 may establish the multipoint-to-point wireless flyway between the two or more flyway candidate ToRs and the destination ToR (1006). System 110 may apply the beam-forming coefficient to respective data symbols of the each source ToR, where the each source ToR is configured to generate an RF signal to transmit. System 110 may receive, at the destination ToR, respective data symbols from the two or more flyway candidate ToRs via the multipoint-to-point wireless flyway (1008). The destination ToR may concurrently receive RF signals transmitted from the two or more flyway candidate ToRs. The RF signals may have been beam-formed to form an uplink multi-user multiple-input and multiple-output (UL-MU-MIMO) signal.

FIG. 11 illustrates an example method embodiment of routing reverse traffic from a destination ToR switch to a source ToR switch. As discussed above, although MU-MIMO links are capable of providing a high-volume traffic pathway that bypasses the wired network, this traffic is typically unidirectional (i.e., it travels from the source ToR to the destination ToR but not the other way around). However, some packets may need to go back over a reverse path from the destination ToR to the source ToR as well in order to keep the link up and carry response traffic such as TCP ACKs. In order to ensure that the reverse traffic (i.e., traffic that would normally flow in the opposite direction of a full-duplex link) does not require the establishment of a separate MI-MIMO radio channel and can be carried over the wired network, system 110 can employ a UDLR routing.

In particular, system 110 can use UDLR to avoid having to establish a reverse channel over the wireless flyway. Thus, system 110 can establish a multi-user MIMO wireless flyway from a source ToR to a destination ToR (1102). Then, system 110 can create a routing adjacency between the source ToR and the destination ToR (1104). System 110 can mark the routing adjacency at the destination ToR switch as UDLR (1106), with the next hop for packets about to be forwarded over the reverse direction from the destination ToR to the source ToR to instead go over the wired network. The routing adjacency may be created on both the source ToR and the destination ToR to represent the link. Once such adjacency is created, the source-to-destination traffic can flow over the MU-MIMO channel while the destination-to-source traffic (i.e., reverse traffic) may be diverted to the wired network such that when packets arrive at the destination ToR for a destination for which the best next routing hop is the source ToR, the packets can go over the wired network. Thus, system 110 can transmit, from the destination ToR, a packet with a next hop to the source ToR via a wired network (1108).

System 110 can transmit the reverse-traffic packet from the destination ToR to the source ToR via the wired network by encapsulating the packet with the destination ToR as the "source" and the source ToR as the "destination, and tunneling the packet by setting the route to the source ToR to a next-hop router on the wired network. Alternatively, system 110 may also insert a "source route" in the reverse-traffic packet explicitly pointing the packet to a next hop on the wired network. System 110 may also use an SDN controller to directly program the data plane of the wired switches to ensure that the packets arriving at the destination ToR whose next hop would normally be the source ToR go through a series of switches on the wired network instead. When the multi-user MIMO wireless flyway is terminated, system 110 may also remove the routing adjacency created between the source ToR and the destination ToR (1110).

For clarity of explanation, in some instances the present technology may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, computer-readable storage media or devices expressly exclude transitory media such as energy, carrier signals, electromagnetic waves, and signals per se.

Methods according to the above-described examples can be implemented using computer-executable instructions that are stored or otherwise available from computer readable media or devices. Such instructions can include, for example, instructions and data which cause or otherwise configure a general purpose computer, special purpose computer, or special purpose processing device to perform a certain operation or group of operations. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, Universal Serial Bus (USB) devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims. Thus, the claims are not intended to be limited to the aspects shown herein, but are to be accorded the full scope consistent with the language claims, wherein reference to an element in the singular is not intended to mean "one and only one" unless specifically so stated, but rather "one or more."

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs. Moreover, claim language reciting "at least one of" a set indicates that one member of the set or multiple members of the set satisfy the claim.

We claim:

1. A method comprising:
  identifying, at a source top-of-rack (ToR) switch connected to a group of ToR switches via a base network, a plurality of destination ToR switches from the group of ToR switches to send data traffic to;
  determining whether each destination ToR switch of the plurality of destination ToR switches is suitable for receiving data transmission via a point-to-multipoint wireless flyway, to yield two or more flyway candidate ToR switches, wherein the each destination ToR switch is determined to be part of the two or more flyway candidate ToR switches when respective channel state information (CSI) associated with the each destination ToR switch has been received at the source ToR switch within a predetermined past time period;

establishing the point-to-multipoint wireless flyway between the source ToR switch and the two or more flyway candidate ToR switches; and transmitting the data traffic from the source ToR switch to the each flyway candidate ToR switch of the two or more flyway candidate ToR switches via the point-to-multipoint wireless flyway.

2. The method of claim 1, wherein the base network is a wired network.

3. The method of claim 1, wherein the each destination ToR switch is determined to be part of the two or more flyway candidate ToR switches when the each destination ToR switch is within a threshold range of a transceiver associated with the source ToR switch.

4. The method of claim 3, further comprising:
when a particular destination ToR switch of the plurality of destination ToR switches is determined to be out of the threshold range of the transceiver, routing the data traffic from the source ToR switch to the particular destination ToR switch via the base network.

5. The method of claim 1, further comprising:
when CSI associated with a particular destination ToR switch of the plurality of destination ToR switches has not been received at the source ToR switch within the predetermined time in the past, routing the data traffic to the particular destination ToR switch via the base network.

6. The method of claim 1, further comprising:
when CSI associated with a particular destination ToR switch of the plurality of destination ToR switches has not been received at the source ToR switch within the predetermined time in the past, routing the data traffic to the particular destination ToR switch via the base network.

7. The method of claim 1, wherein a number of the two or more flyway candidate ToR switches is a tunable parameter that depends on a number of antennas available for establishing the point-to-multipoint wireless flyway.

8. The method of claim 1, wherein establishing the point-to-multipoint wireless flyway comprises calculating a beam-forming coefficient based on respective CSI associated with each of the two or more flyway candidate ToR switches.

9. The method of claim 8, wherein the beam-forming coefficient is to be applied to data symbols for generating a radio frequency (RF) signal.

10. The method of claim 8, wherein, when the beam-forming coefficient calculated based on the respective CSI fails to meet a threshold condition, selecting a different group of destination ToR switches of the plurality of destination ToR switches to be the two or more flyway candidate ToR switches.

11. The method of claim 1, wherein transmitting the data traffic comprises transmitting an RF signal from a transceiver associated with the source ToR switch to a respective transceiver associated with the each flyway candidate ToR switch via a downlink multi-user multiple-input and multiple-output (DL-MU-MIMO) signal.

12. The method of claim 1, further comprising:
receiving, at the source ToR switch, a control packet from the each flyway candidate ToR switch via the base network.

13. The method of claim 1, further comprising:
creating a routing adjacency between the source ToR switch and the one of the two or more flyway candidate ToR switches;
marking, at the one of the two or more flyway candidate ToR switches, the routing adjacency as a unidirectional link routing (UDLR);
receiving, at the source ToR switch and via the base network, a packet from the one of the two or more flyway candidate ToR switches, the packet having a next hop to the source ToR; and
when the point-to-multipoint wireless flyway is terminated, removing the routing adjacency.

14. An apparatus comprising:
a source top-of-rack (ToR) switch connected to a group of ToR switches via a base network;
a processor; and
a computer-readable storage medium storing instructions which, when executed by the processor, cause the processor to perform operations comprising:
identifying, at the source ToR switch, a plurality of destination ToR switches from the group of ToR switches to send data traffic to;
determining whether each destination ToR switch of the plurality of destination ToR switches is suitable for receiving data transmission via a point-to-multipoint wireless flyway, to yield two or more flyway candidate ToR switches, wherein the each destination ToR switch is determined to be part of the two or more flyway candidate ToR switches when respective channel state information (CSI) associated with the each destination ToR switch has been received at the source ToR switch within a predetermined past time period;
establishing the point-to-multipoint wireless flyway between the source ToR switch and the two or more flyway candidate ToR switches; and
transmitting the data traffic from the source ToR switch to the each flyway candidate ToR switch of the two or more flyway candidate ToR switches via the point-to-multipoint wireless flyway.

* * * * *